(12) United States Patent
Shigyo et al.

(10) Patent No.: US 6,956,747 B1
(45) Date of Patent: Oct. 18, 2005

(54) SEMICONDUCTOR DEVICE

(75) Inventors: Naoyuki Shigyo, Yokohama (JP);
Takayuki Hiraoka, Kawasaki (JP);
Kentaro Watanabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/051,729

(22) Filed: Feb. 4, 2005

(30) Foreign Application Priority Data

Jun. 3, 2004 (JP) .............................. 2004-166324
Jan. 20, 2005 (JP) .............................. 2005-012896

(51) Int. Cl.[7] ............................ H05K 1/11; H05K 1/14
(52) U.S. Cl. .................. 361/793; 361/794; 361/306.1; 257/303
(58) Field of Search ................ 361/793–795, 361/306.1, 306.2, 306.3; 257/303–306, 532; 438/253, 254

(56) References Cited

U.S. PATENT DOCUMENTS 6,333,239 B1 * 12/2001 Aitken et al. ............... 438/396
6,399,974 B1 *  6/2002 Ohtsuki ...................... 257/296
6,617,208 B2 *  9/2003 Saran ......................... 438/240

FOREIGN PATENT DOCUMENTS

JP           6-5705        1/1994
JP     P2002-83933 A       3/2002
JP    P2003-124336 A       4/2003

* cited by examiner

*Primary Examiner*—Kamand Cuneo
*Assistant Examiner*—Tuan Dinh
(74) *Attorney, Agent, or Firm*—DLA Piper Rudnick Gray Cary US LLP

(57) ABSTRACT

There is disclosed a semiconductor device comprising at least one first pad being formed above a substrate and given a first potential, at least one first conductive layer being formed between the first pad and the substrate so as to be electrically connected to the first pad, at least one second pad being formed above the substrate so as to sandwich the at least one first conductive layer between the second pad and the substrate, and given a second potential different from the first potential, at least one second conductive layer being formed between the first and second pads and the substrate so as to be electrically connected to the second pad, and a plurality of insulating layers being stacked on the substrate and at least one of the insulating layers being as an interelectrode insulator of a capacitance element.

11 Claims, 7 Drawing Sheets

SEMICONDUCTOR DEVICE

CROSS-REFERENCE TO RELATED APPLICATIONS

This application is based upon and claims the benefit of priority from prior Japanese Patent Applications No. 2004-166324, filed Jun. 3, 2004; and No. 2005-012896, filed Jan. 20, 2005, the entire contents of both of which are incorporated herein by reference.

BACKGROUND OF THE INVENTION

1. Field of the Invention

The present invention relates to a technique which protects a semiconductor device against electro static destroy (ESD) caused by electro static discharge (ESD) and, more particularly, to a semiconductor device in which a protective element for electro static destroy is formed below a pad.

2. Description of the Related Art

Several techniques for protecting a semiconductor device against electro static discharge (ESD) have been proposed so far. An example is a technique which forms an electro static discharge protecting element (ESD protecting circuit) between a pad and substrate. For example, Jpn. Pat. Appln. KOKAI Publication No. 2003-124336 discloses a device for improving the ESD protection performance of a semiconductor integrated circuit (CMOS). In this device, a passive element (polysilicon resistor) is formed below a bonding pad and above a non-conductive layer formed on a substrate. The device is characterized in that this polysilicon resistor is placed between the bonding pad and an integrated circuit and connected to them.

The main purpose of this device disclosed in Jpn. Pat. Appln. KOKAI Publication No. 2003-124336 is to reduce the stress in the bonding pad. From the viewpoint of ESD protection, it is difficult to say that the ESD protection performance of this device is improved, since the polysilicon resistor is simply inserted between the bonding pad and integrated circuit.

BRIEF SUMMARY OF THE INVENTION

According to an aspect of the invention, there is provided a semiconductor device comprising: at least one first pad, the first pad being formed above a substrate and given a first potential; at least one first conductive layer, the first conductive layer being formed between the first pad and the substrate so as to be electrically connected to the first pad; at least one second pad, the second pad being formed above the substrate so as to sandwich the at least one first conductive layer between the second pad and the substrate, and given a second potential different from the first potential; at least one second conductive layer, the second conductive layer being formed between the first or second pads and the substrate so as to be electrically connected to the second pad; and a plurality of insulating layers, the insulating layers being stacked on the substrate, at least one first pad, at least one second pad, at least one first conductive layer, and at least one second conductive layer being formed in predetermined ones of the insulating layers, and at least one of the insulating layers being sandwiched, as an inter-electrode insulator of a capacitance element, between at least one of the first pad and first conductive layer and at least one of the second pad and second conductive layer in at least one of a direction in which the insulating layers are stacked and a direction perpendicular to the direction in which the insulating layers are stacked.

DETAILED DESCRIPTION OF THE INVENTION

Embodiments of the present invention will be described below with reference to the accompanying drawing.

First Embodiment

Figure 1:
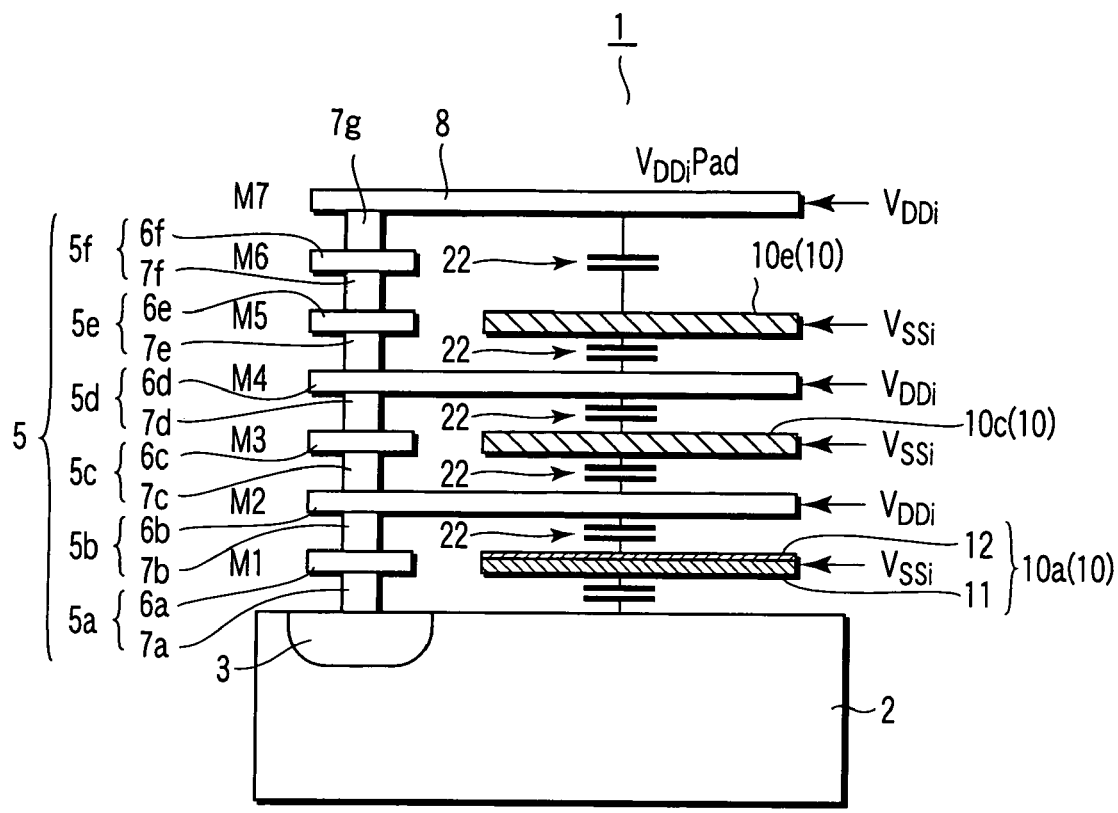
FIG. 1 is a view schematically showing an outline of the arrangement of a semiconductor device according to the first embodiment.
Figure 2:
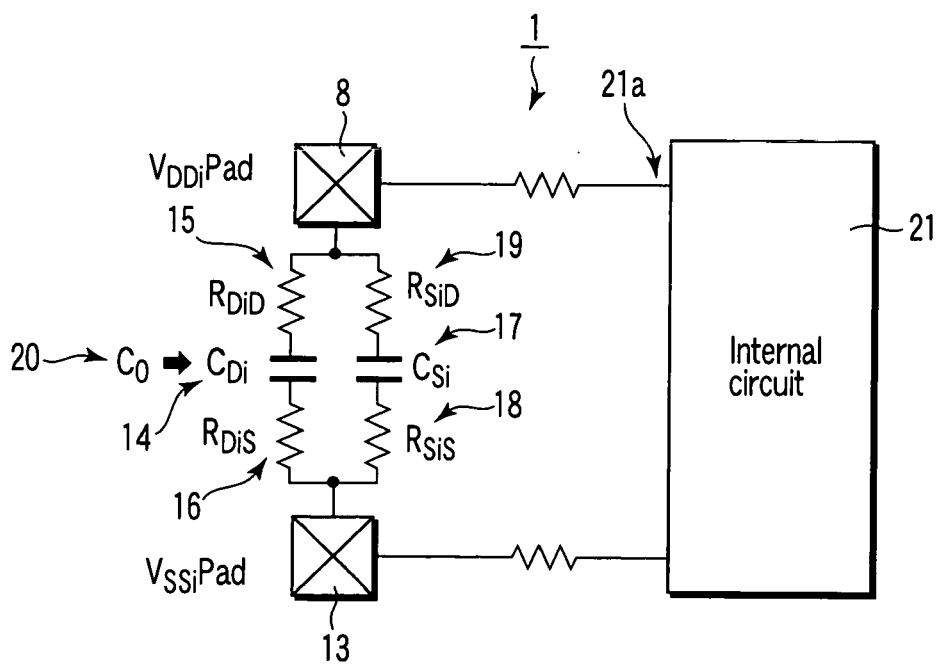
FIG. 2 is a view showing an outline of the circuit configuration of the semiconductor device according to the first embodiment.
Figure 3:
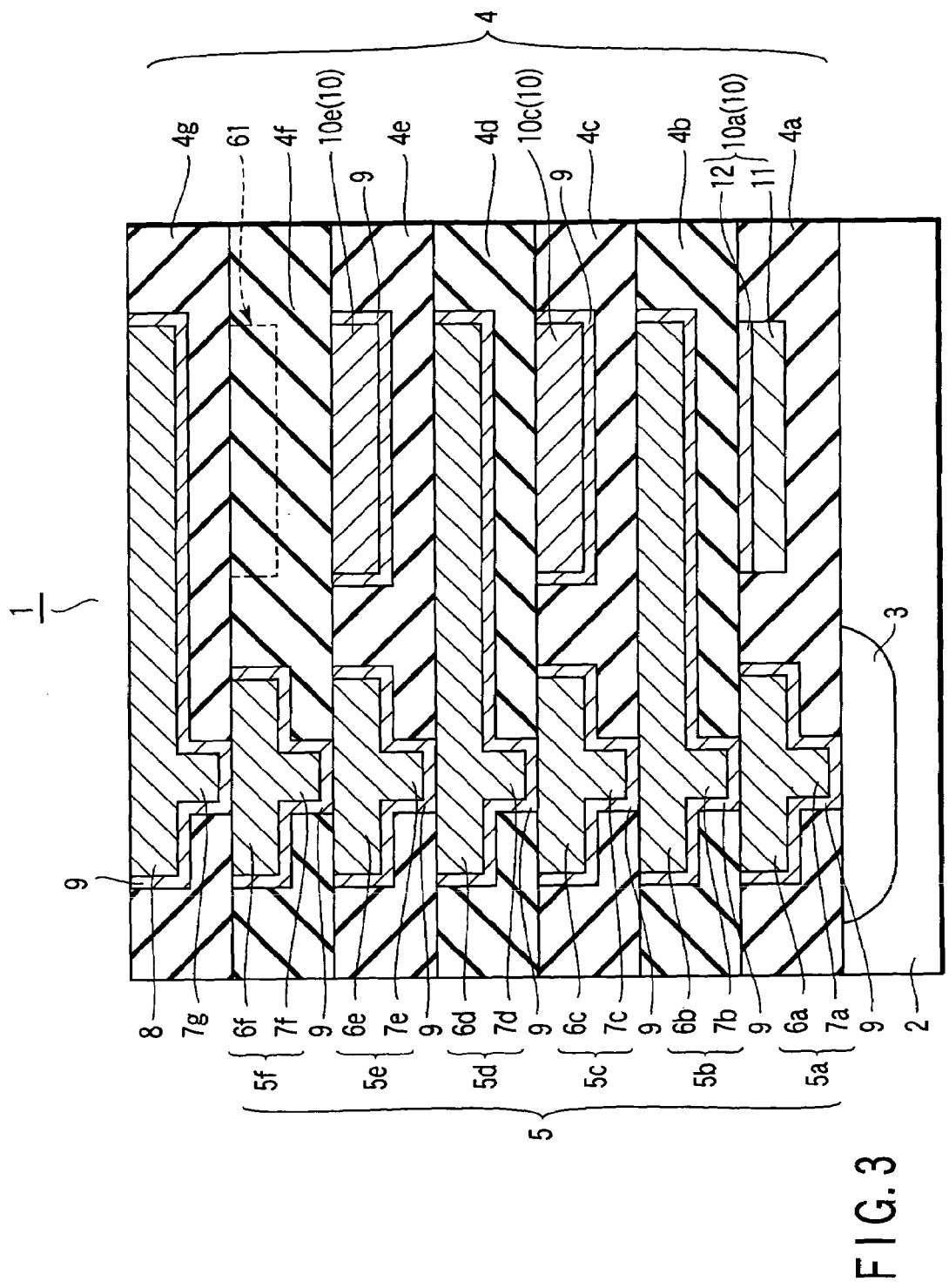
FIG. 3 is a sectional view showing an outline of the semiconductor device according to the first embodiment.
Figure 4:
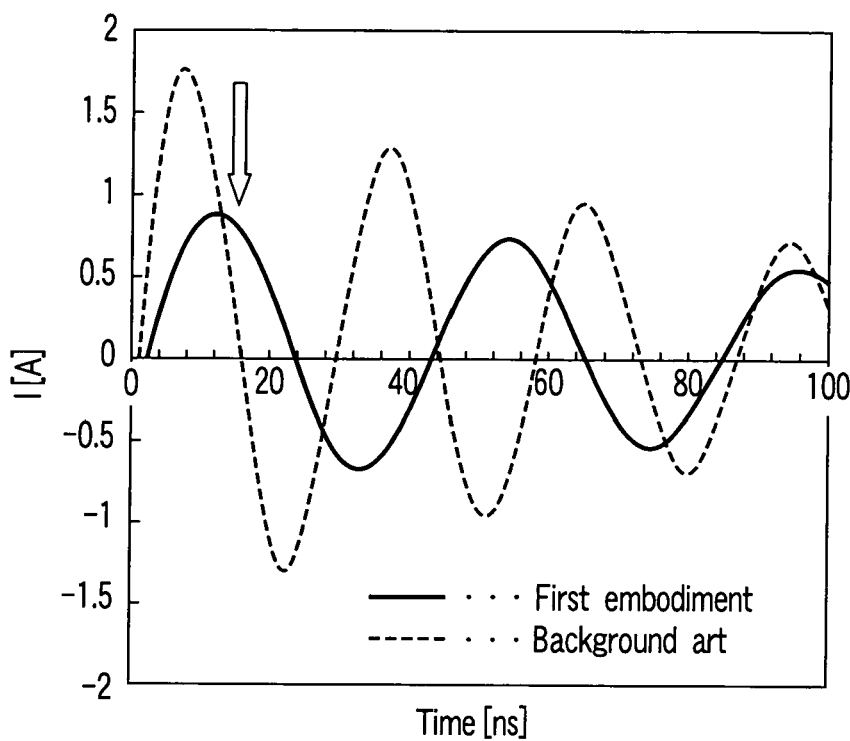
FIG. 4 is a graph which compares the magnitude of an overcurrent flowing through the semiconductor device according to the first embodiment and the magnitude of an overcurrent flowing through a semiconductor device according to the background art.

The first embodiment according to the present invention will be descried below with reference to FIGS. 1 to 4. FIG. 1 is a view schematically showing an outline of the arrangement of a semiconductor device according to this embodiment. FIG. 2 is a view showing an outline of the circuit configuration of the semiconductor device according to this embodiment. FIG. 3 is a sectional view showing an outline of the semiconductor device according to this embodiment. FIG. 4 is a graph which compares the magnitude of an overcurrent flowing through the semiconductor device according to this embodiment and the magnitude of an overcurrent flowing through a semiconductor device according to the background art.

This embodiment is directed to a protective element for preventing an unnecessary electric current such as an overcurrent (surge) from flowing into a semiconductor device (semiconductor chip). Recently, with the decrease in thickness of an insulating film of a CMOS transistor or the like, the importance of an electro static destroy protective element (ESD protective element) for protecting an insulating film against electro static destroy (ESD) is increasing. In addition, with high integration and downsizing of semiconductor devices, a method of effectively using the area of a semiconductor chip is being required. To meet these demands, in this embodiment as shown in FIG. 1, at least one capacitance element 22 is formed on a semiconductor substrate 2 including the lower layer of a pad 8 of a semiconductor device 1 by using the pad 8 and interconnections 5 and 10, which are different in potential. The capacitance element 22 is allowed to absorb an overcurrent caused by ESD. In this manner, the ESD resistance of a semiconductor chip is increased. That is, at least one capacitance element 22 as an ESD protective element is formed between the pad 8 and semiconductor substrate 2 so that a portion of the pad 8 is included. The first embodiment will be described in detail below.

First, the semiconductor device 1 of this embodiment will be explained with reference to FIG. 3. In the semiconductor device 1, seven insulating layers 4 are stacked on the substrate 2. A p-type silicon substrate is used as the substrate 2. A heavily doped diffusion layer 3 is formed in the surface layer of a predetermined region of the p-type silicon substrate 2. To obtain an ohmic contact, the heavily doped diffusion layer 3 is formed only in a contact region of the surface layer of the p-type silicon substrate 2. Each insulating layer 4 is made of an insulating material such as $SiO_2$. Each insulating layer 4 is a so-called interlayer dielectric film.

Of the interlayer dielectric films 4, a seventh interlayer dielectric film 4g as the uppermost layer has a first pad 8 to which $V_{DDi}$ as the first potential is applied. The first pad ($V_{DDi}$ pad) 8 is integrated with a plug (via plug or contact plug) 7g for obtaining an electrical connection between the first pad 8 and a conductive layer below the first pad 8. That is, the $V_{DDi}$ pad 8 has a so-called dual damascene structure. Also, of the interlayer dielectric films 4, first, second, third, fourth, fifth, and sixth interlayer dielectric films 4a, 4b, 4c, 4d, 4e, and 4f each have a first interconnecting layer ($V_{DDi}$ interconnection) 5 as the first conductive layer electrically connected to the $V_{DDi}$ pad 8. Similar to the $V_{DDi}$ pad 8, first interconnecting layers 5a, 5b, 5c, 5d, 5e, and 5f as the first, second, third, fourth, fifth, and sixth layers have dual damascene structures in which interconnection main bodies (conductive layer main bodies) 6a, 6b, 6c, 6d, 6e, and 6f and plugs (via plugs contact plugs) 7a, 7b, 7c, 7d, 7e, and 7f are integrated. In addition, a barrier metal film 9 is formed on the surface of each of the $V_{DDi}$ pad 8 and first interconnecting layers 5a to 5f.

The $V_{DDi}$ pad 8 and first interconnecting layers 5a to 5f are made of a conductive material such as aluminum (Al), gold (Au), or copper (Cu). The barrier metal film 9 is made of a material having barrier properties. Examples are titanium (Ti), tantalum (Ta), and tungsten (W).

Of the first interconnecting layers 5a to 5f as the first to sixth layers, the interconnection main body 6b of the first interconnecting layer 5b as the second layer and the interconnection main body 6d of the first interconnecting layer 5d as the fourth layer are extended to substantially the same size as the $V_{DDi}$ pad 8 along the surfaces of the interlayer dielectric films 4b and 4d so as to overlap each other in a direction in which second conductive layers 10 (to be described later) and the interlayer dielectric films 4 are stacked. By contrast, the interconnection main bodies 6a, 6c, 6e, and 6f of the first interconnecting layers 5a, 5c, 5e, and 5f as the first, third, fifth, and sixth layers are made smaller than the $V_{DDi}$ pad 8 and the second and fourth interconnection main bodies 6b and 6d so as not to contact each other in the second conductive layer 10 and interlayer dielectric films 4a, 4c, 4e, and 4f.

Furthermore, of the first to seventh interlayer dielectric films 4a to 4g, the first, third, and fifth interlayer dielectric films 4a, 4c, and 4e each have the second interconnecting layer ($V_{SSi}$ interconnection) 10 as the second conductive layer. Although not shown, second interconnecting layers 10a, 10c, and 1e are electrically connected to a second pad to which $V_{SSi}$ as the second potential different from the first potential $V_{DDi}$ is applied. A $V_{SSi}$ pad as the second pad is formed in the seventh interlayer dielectric film 4g in which the $V_{DDi}$ pad 8 as the first pad is formed. The second interconnecting layers 10a, 10c, and 10e as the first, third, and fifth layers and the $V_{SSi}$ pad are electrically connected by a structure identical to the structure connecting the first interconnecting layers 5a to 5f and the $V_{DDi}$ pad 8. Although not shown, of the second interconnecting layers 10a, 10c, and 10e as the first, third, and fifth layers, the second interconnecting layer 10a as the first layers formed in the first interlayer dielectric film 4a is electrically connected, via a plug, to the heavily doped diffusion layer 3 formed in the surface layer of the p-type silicon substrate 2. That is, the $V_{SSi}$ pad and the second interconnecting layers 10a, 10c, and 10e as the first, third, and fifth layers are electrically connected to the heavily doped diffusion layer 3 formed in the surface layer of the p-type silicon substrate 2. Note that the second potential $V_{SSi}$ is lower than the first potential $V_{DDi}$. Note also that the heavily doped diffusion layer 3 is formed only in a contact region for obtaining an ohmic contact in the surface layer of the p-type silicon substrate 2.

Of the second interconnecting layers 10a, 10b, and 10c as the first, third, and fifth layers, the second interconnecting layer 10a as the first layers formed in the first interlayer dielectric film (insulating layer) 4a closest to the p-type silicon substrate 2 has a two-layered structure including a polysilicon layer 11 as the lower layer and a silicide layer 12 as the upper layer. By contrast, similar to the first interconnecting layers 5a to 5f, the second interconnecting layers 10c and 10e as the third and fifth layers are made of a conductive material such as Al, Au, or Cu. In addition, a barrier metal film 9 is formed on the surfaces of each of the second interconnecting layers 10c and 10e as the third and fifth layers. Also, although not shown in FIG. 3, the $V_{SSi}$ pad has the same structure as the $V_{DDi}$ pad 8.

As described above, in the semiconductor device 1 of this embodiment shown in FIG. 3, between the p-type silicon substrate 2 and the $V_{DDi}$ pad 8 formed above the p-type silicon substrate 2, the first, third, and fifth $V_{SSi}$ interconnections 10a, 10c, and 10e to which the potential $V_{SSi}$ is applied alternately oppose the $V_{Di}$ pad 8 and fourth and second $V_{DDi}$ interconnections 5d and 5b, to each of which the potential $V_{DDi}$ is applied, and the p-type silicon substrate 2, in the direction in which the interlayer dielectric films 4 are stacked. Alternatively, between the p-type silicon substrate 2 and the $V_{SSi}$ pad formed above the p-type silicon substrate 2, the fourth and second $V_{DDi}$ interconnections 5d and 5b to which the potential $V_{DDi}$ is applied alternately oppose the fifth, third, and first $V_{SSi}$ interconnections 10e, 10c, and 10a to which the potential $V_{SSi}$ is applied, in the direction in which the interlayer dielectric films 4 are stacked. In this manner, a substantially plurality of capacitance elements (capacitors) 22 are formed between the p-type silicon substrate 2, $V_{DDi}$ pad 8, and $V_{SSi}$ pad.

More specifically, one capacitance element 22 is formed by using the $V_{DDi}$ pad 8 and the fifth $V_{SSi}$ interconnection 10e as the electrodes on the power-supply potential side and on the ground potential side, respectively, and using the seventh and sixth interlayer dielectric films 4g and 4f sandwiched between the $V_{DDi}$ pad 8 and fifth $V_{SSi}$ interconnection 10e as an inter-electrode insulator (inter-electrode dielectric material). This inter-electrode insulator made up of the seventh and sixth interlayer dielectric films 4g and 4f functions as a so-called capacitance insulating film (capacitor insulating film). Similarly, one capacitance element 22 is formed by using the fifth $V_{SSi}$ interconnection 10e and the fourth $V_{DDi}$ interconnection 5d as the electrodes on the power-supply potential side and on the ground potential side, respectively, and using the fifth interlayer dielectric films 4e sandwiched between the fifth $V_{SSi}$ interconnection 10e and fourth $V_{DDi}$ interconnection 5d as an inter-electrode insulator (capacitance insulating film). Also, one capacitance element 22 is formed by using the fourth $V_{DDi}$ interconnection 5d and the third $V_{SSi}$ interconnection 10c as the electrodes on the power-supply potential side and on the ground potential side, respectively, and using the fourth interlayer dielectric film 4d sandwiched between the fourth $V_{DDi}$ interconnection 5d and the third $V_{SSi}$ interconnection 10c as an inter-electrode insulator (capacitance insulating film). Likewise, one capacitance element 22 is formed by using the third $V_{SSi}$ interconnection 10c and the second $V_{DDi}$ interconnection 5b as the electrodes on the power-supply potential side and on the ground potential side, respectively, and using the third interlayer dielectric film 4c sandwiched between the third $V_{SSi}$ interconnection 10c and the second $V_{DDi}$ interconnection 5b as an inter-electrode insulator (capacitance insulating film). Furthermore, one capacitance element 22 is formed by using the second $V_{DDi}$ interconnection 5b and the first $V_{SSi}$ interconnection 10a as the electrodes on the power-supply potential side and on the ground potential side, respectively, and using the second interlayer dielectric film 4b sandwiched between the second $V_{DDi}$ interconnection 5b and the first $V_{SSi}$ interconnection 10a as an inter-electrode insulator (capacitance insulating film). One capacitance element 22 is also formed by using the first $V_{SSi}$ interconnection 10a and the p-type silicon substrate 2 as the electrodes on the ground potential side and the power-supply potential side, respectively, and using the first interlayer dielectric film 4a sandwiched between the first $V_{SSi}$ interconnection 10a and the p-type silicon substrate 2 as an inter-electrode insulator (capacitance insulating film).

As described above, in the capacitance element 22 using the $V_{DDi}$ pad 8 as one electrode, the conductive layer (interconnecting layer) formed in the sixth interlayer dielectric film 4f as an insulating layer immediately below the insulating layer in which the $V_{DDi}$ pad 8 is formed is not used. In this capacitance element 22 in which the $V_{DDi}$ pad 8 is used as one electrode, the conductive layer (interconnecting layer) formed in a layer at least two or more layers below the layer in which the $V_{DDi}$ pad 8 is formed is used. Although not shown in FIG. 3, this interconnection structure below the $V_{DDi}$ pad 8 is also used in the capacitance element 22 using the $V_{SSi}$ pad as one electrode.

In the semiconductor device 1 of this embodiment as described above, substantially six capacitance elements 22 are formed between the p-type silicon substrate 2 and $V_{DDi}$ pad 8, along the direction in which the interlayer dielectric films 4 are stacked, by using the interconnecting layers 5b, 5d, 10a, 10c, and 10e and the like formed below the $V_{DDi}$ pad 8. The capacitance elements 22 are used as electro static destroy protective elements (ESD protective elements) of the semiconductor device 1. Although not shown in FIG. 3, this interconnection structure below the $V_{DDi}$ pad 8 is also formed between the p-type silicon substrate 2 and the $V_{SSi}$ pad formed above the p-type silicon substrate 2.

In this embodiment, the area of each of the $V_{DDi}$ pad 8 and $V_{SSi}$ pad is set to about 10,000 $\mu m^2$. Also, the thickness of each of the interlayer dielectric films 4b, 4c, 4d, and 4e between the fifth, third, and first $V_{SSi}$ interconnections 10e, 10c, and 10a and fourth and second $V_{DDi}$ interconnections 5d and 5b is set to about 0.5 $\mu m$. That is, the thickness of each of the inter-electrode insulators (capacitance insulating films) 4b, 4c, 4d, and 4e of the capacitance elements 22 formed by using the fifth, third, and first $V_{SSi}$ interconnections 10e, 10c, and 10a and fourth and second $V_{DDi}$ interconnections 5d and 5b is set to about 0.5 $\mu m$. In addition, the thickness of the interlayer dielectric film 4a between the polysilicon layer 11 as the lower layer of the first $V_{SSi}$ interconnection 10a and the p-type silicon substrate (Si substrate) 2 is set to about 50 nm. That is, the thickness of the inter-electrode insulator (capacitance insulating film) 4a of the capacitance element 22 formed by using the first $V_{SSi}$ interconnection 10a and the p-type silicon substrate 2 is set to about 50 nm. A breakdown voltage of about 100 V can be obtained by setting the thickness of the inter-electrode insulator (capacitance insulating film) 4a between the first $V_{SSi}$ interconnection 10a and p-type silicon substrate 2 to about 50 nm. Furthermore, the six metal interconnecting layers ($V_{DDi}$ interconnections) 5a, 5b, 5c, 5d, 5e, and 5f are formed between the p-type silicon substrate 2 and $V_{DDi}$ pad 8.

FIG. 1 schematically shows an outline of the arrangement of the semiconductor device 1 of this embodiment explained so far. As described above, the six metal interconnecting layers ($V_{DDi}$ interconnections) 5a to 5f, i.e., M1 to M6 are formed between the p-type silicon substrate 2 and $V_{DDi}$ pad 8. The $V_{DDi}$ pad 8 may also be regarded as a seventh metal layer ($V_{DDi}$ interconnection, first interconnecting layer, or first conductive layer) M7.

FIG. 2 shows an outline of the circuit configuration of the semiconductor device 1 of this embodiment explained above. Between the $V_{DDi}$ pad 8 and a $V_{SSi}$ pad 13, a capacitance element $C_{Di}$ 14 and wiring resistance $R_{DiD}$ 15 below the $V_{DDi}$ pad 8 and a wiring resistance $R_{DiS}$ 16 from the $V_{DDi}$ pad 8 to the $V_{SSi}$ pad 13 are arranged. Similarly, between the $V_{DDi}$ pad 8 and $V_{SSi}$ pad 13, a capacitance element $C_{Si}$ 17 and wiring resistance $R_{SiS}$ 18 below the $V_{SSi}$ pad 13 and a wiring resistance $R_{SiD}$ 19 from the $V_{SSi}$ pad 13 to the $V_{DDi}$ pad 8 are arranged. This is equivalent to forming a capacitance Co 20 by synthesizing the capacitance elements $C_{Di}$ 14 and $C_{Si}$ 17 between the $V_{DDi}$ pad 8 and $V_{SSi}$ pad 13. In the semiconductor device 1, the $V_{DDi}$ pad 8 is connected to an input node 21a of an internal circuit 21. Also, the $V_{SSi}$ pad 13 is connected to the other node of the internal circuit 21.

An experiment conducted by the present inventors will be described below with reference to FIG. 4. In this experiment, simulation was performed by assuming a case in which an overcurrent (surge) was applied to each pad of a machine model (MM) of the semiconductor device 1 in which a plurality of capacitance elements 22 were formed below the $V_{DDi}$ pad 8 and $V_{SSi}$ pad 13, and to each pad of a machine model (MM) of a semiconductor device according to the background art in which no capacitance element 22 was formed below the pad. In this way, a current waveform at the input node 21a of the internal circuit 21 shown in FIG. 5 was obtained. Consequently, as shown in the graph of FIG. 4, the current value at the input node 21a of the internal circuit 21 of the semiconductor device 1 of this embodiment was always smaller, at the same hour, than that at the input node of the internal circuit of the semiconductor device according to the background art. In particular, as indicated by the blank arrow in FIG. 4, at the first peak at which the two curves take the largest values, the value of the semiconductor device 1 of this embodiment is about half that of the semiconductor device according to the background art. In general electro static destroy (ESD), the maximum electric current of surge has the most serious effect on a semiconductor device. According to the results of the simulation described above, the probability that the semiconductor device 1 of this embodiment is damaged by electro static destroy is about half the probability that the semiconductor device according to the background art is damaged by electro static destroy, i.e., the former probability is greatly reduced.

In the first embodiment as described above, the peak value of surge which flows near the $V_{DDi}$ pad 8 and $V_{SSi}$ pad 13 is halved by forming the capacitance elements 22 below the $V_{DDi}$ pad 8 and $V_{SSi}$ pad 13.

That is, the ESD resistance of the pad is improved by suppressing an overcurrent flowing into the pad.

Also, the capacitance elements 22 as electro static destroy protective elements (ESD protective elements) are formed by using the metal interconnecting layers (conductive layers) 5a to 5f, 10a, 10c, and 10e, and the first to seventh interlayer dielectric films 4a to 4g formed between the $V_{DDi}$ pad 8, $V_{SSi}$ pad 13, and p-type silicon substrate 2. Accordingly, the spaces between the $V_{DDi}$ pad 8, $V_{SSi}$ pad 13, and p-type silicon substrate 2 can be effectively used. That is, the area of the semiconductor device (semiconductor chip) 1 can be effectively used. In addition, when the capacitance element 22 using one of the $V_{DDi}$ pad 8 and $V_{SSi}$ pad 13 as one electrode is to be formed, the stress applied to the pad can be reduced because the interconnecting layer immediately below the $V_{DDi}$ pad 8 and $V_{SSi}$ pad 13 is not used. This improves the reliability of the semiconductor device 1 as a product. Consequently, it is possible to realize high integration and downsizing of the semiconductor device 1 and improve the durability and reliability of the semiconductor device 1 at the same time.

Second Embodiment

Figure 5:
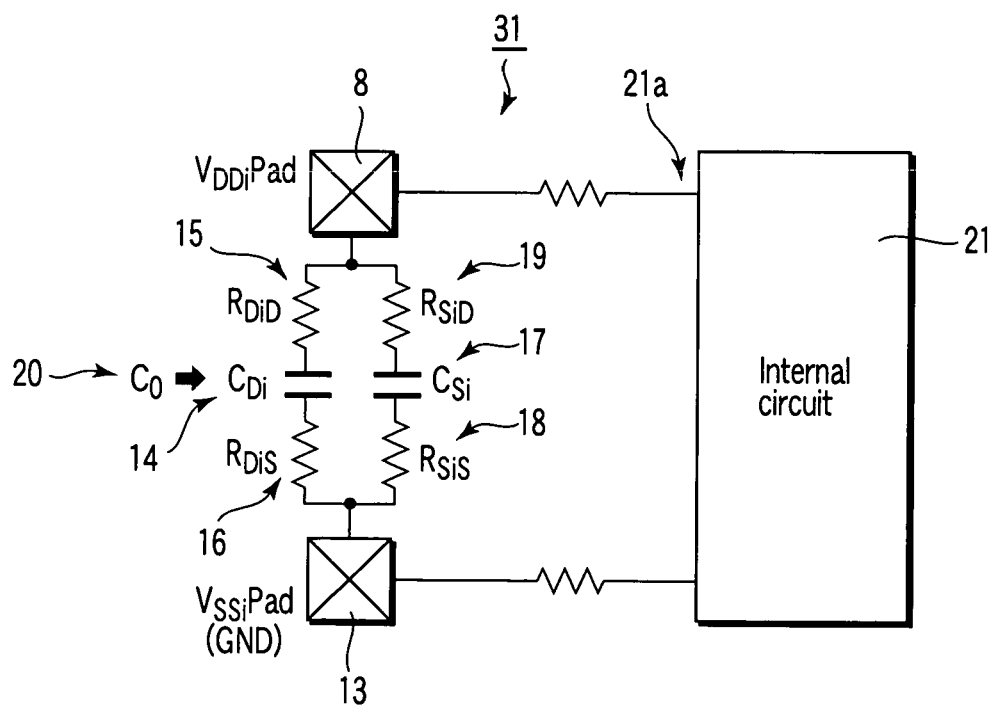
FIG. 5 is a view showing an outline of the circuit configuration of a semiconductor device according to the second embodiment.

The second embodiment according to the present invention will be described below with reference to FIG. 5. FIG. 5 is a view showing an outline of the circuit configuration of a semiconductor device according to this embodiment. Note that the same reference numerals as in the first embodiment described above denote the same parts, and a detailed explanation thereof will be omitted.

In this embodiment, of a $V_{DDi}$ pad 8 and $V_{SSi}$ pad 13 of the semiconductor device 1 of the first embodiment, the $V_{SSi}$ pad 13 is grounded. That is, $V_{SSi}$ is set at the ground potential (GND).

As shown in FIG. 5, a semiconductor device 31 of this embodiment has the same arrangement as the semiconductor device 1 of the first embodiment except that the $V_{SSi}$ pad 13 is grounded.

In the second embodiment as explained above, the same effects as in the first embodiment can be obtained. In addition, since $V_{SSi}$ as the second potential is set at the ground potential (GND), the $V_{SSi}$ pad 13 and fifth, third, and first $V_{SSi}$ interconnections 10e, 10c, and 10a electrically connected to the $V_{SSi}$ pad 13 can be used as a discharge line (earth) to ESD. For example, an overcurrent (surge) flowing into the $V_{SSi}$ pad 13 and $V_{SSi}$ interconnections 10a, 10c, and 10e can be rapidly discharged to the ground via the $V_{SSi}$ pad 13 and $V_{SSi}$ interconnections 10a, 10c, and 10e. As a consequence, it is possible to well prevent an overcurrent from flowing into an internal circuit 21 and the like.

Furthermore, in the interconnecting structure of the semiconductor device 31 described above, the $V_{SSi}$ pad 13 and $V_{SSi}$ interconnections 10a, 10c, and 10e form a plurality of capacitance elements (capacitors) 22 inside the semiconductor device 31 together with the $V_{DDi}$ pad 8, first to sixth $V_{DDi}$ interconnections 5a to 5f electrically connected to the $V_{DDi}$ pad 8, and the like. Consequently, an overcurrent flowing into the $V_{DDi}$ pad 8 and $V_{DDi}$ interconnections 5a to 5f can be temporarily absorbed by the capacitance elements 22, and rapidly discharged to the ground via the $V_{SSi}$ pad 13 and $V_{SSi}$ interconnections 10a, 10c, and 10e. This makes it possible to well prevent an overcurrent from flowing into the internal circuit 21, a power supply (not shown), and the like.

As described above, in the interconnecting structure of the semiconductor device 31 of this embodiment, the $V_{SSi}$ pad 13 and $V_{SSi}$ interconnections 10a, 10c, and 10e can be used as a so-called common discharge line (common earth line) in the semiconductor device 31. By this common discharge line, an overcurrent generated not only in the $V_{SSi}$ pad 13 and $V_{SSi}$ interconnections 10a, 10c, and 10e but also in the $V_{DDi}$ pad 8 and $V_{DDi}$ interconnections 5a to 5f or in another interconnection (circuit) (not shown) in the semiconductor device 31 can be rapidly discharged outside the semiconductor device 31 without allowing the overcurrent to flow into the internal circuit 21 of the semiconductor device 31 or into another semiconductor element or power supply. This increases the ESD resistance and improves the durability and reliability of the semiconductor device 31 of this embodiment. Note that the technique related to the common discharge line (common earth line) as explained above is disclosed in, e.g., Jpn. Pat. Appln. KOKOKU Publication No. 6-5705.

Third Embodiment

Figure 6:
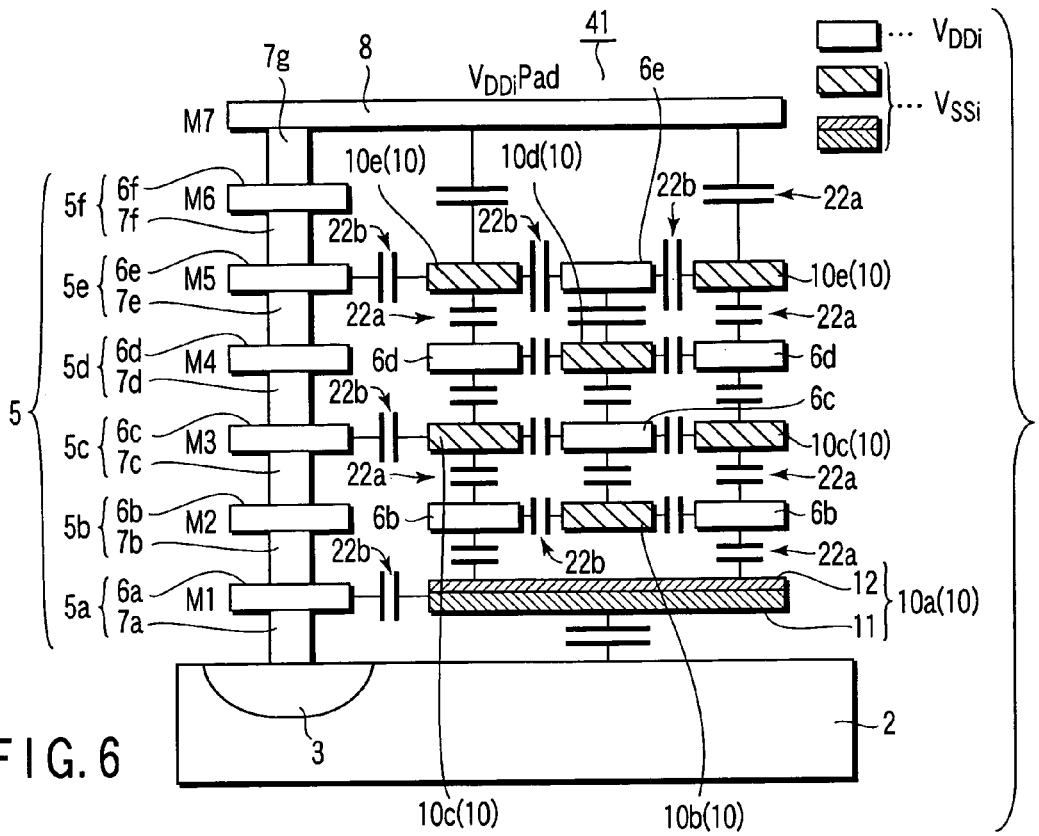
FIG. 6 is a view schematically showing an outline of the arrangement of a semiconductor device according to the third embodiment.
Figure 7:
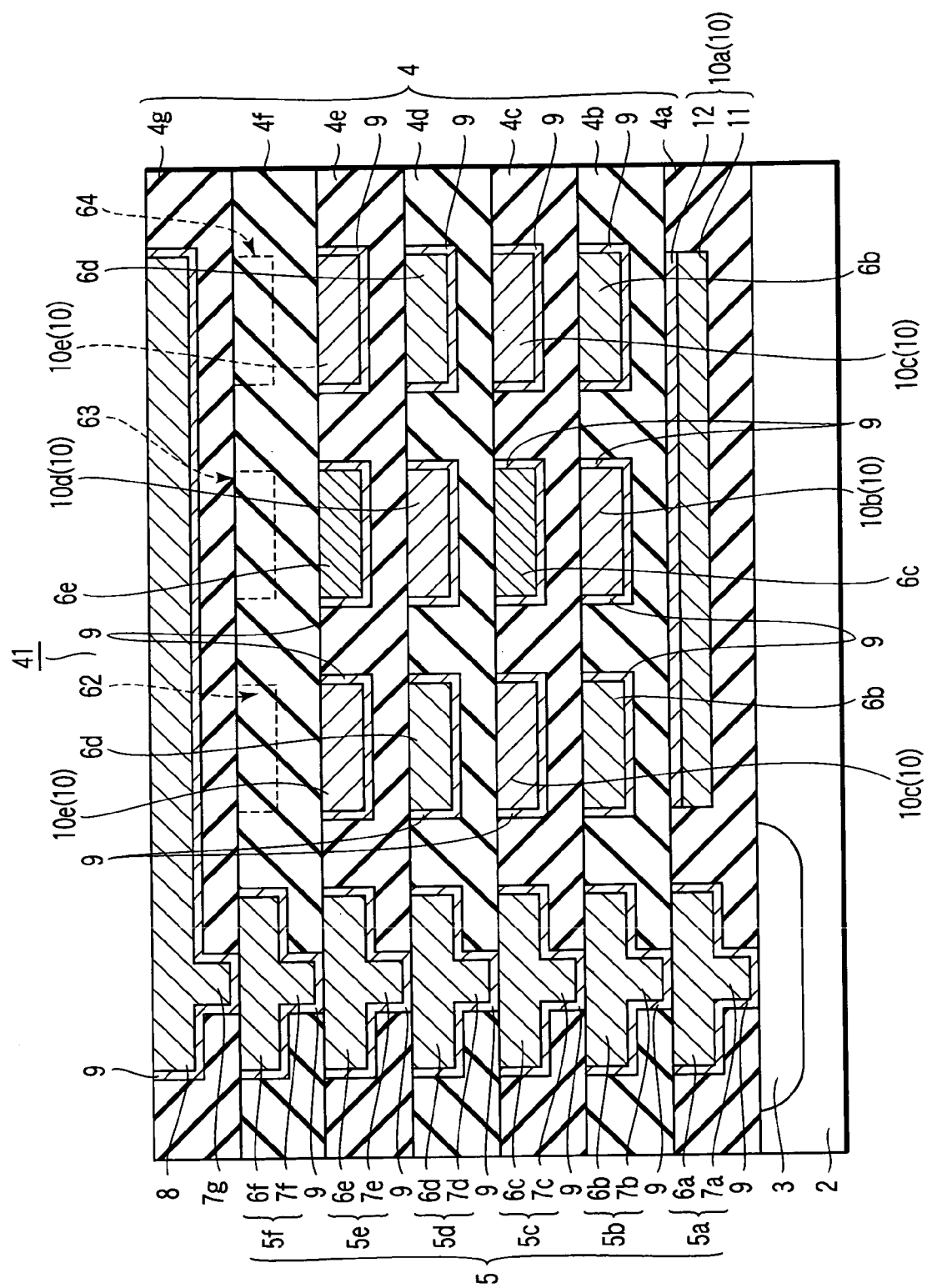
FIG. 7 is a sectional view showing an outline of the semiconductor device according to the third embodiment.

The third embodiment according to the present invention will be described below with reference to FIGS. 6 and 7. FIG. 6 is a view schematically showing an outline of the arrangement of a semiconductor device according to this embodiment. FIG. 7 is a sectional view showing an outline of the semiconductor device according to this embodiment. Note that the same reference numerals as in the first and second embodiments described above denote the same parts, and a detailed explanation thereof will be omitted.

In this embodiment, in the semiconductor devices 1 and 31 of the first and second embodiments, $V_{DDi}$ interconnections 5 ($V_{DDi}$ interconnection main bodies 6a to 6f) and $V_{SSi}$ interconnections 10 formed between a $V_{DDi}$ pad 8, $V_{SSi}$ pad 13, and p-type silicon substrate 2 are alternately arranged not only in a direction in which interlayer dielectric films 4 are stacked, but also in the direction perpendicular to a direction in which the interlayer dielectric films 4 are stacked. This embodiment will be explained below.

In a semiconductor device 41 of this embodiment as shown in FIG. 7, in first to sixth first conductive layers ($V_{DDi}$ interconnections) 5a to 5f, the $V_{DDi}$ interconnections 6a to 6f which electrically connect the $V_{DDi}$ pad 8 and a heavily doped diffusion layer 3 of the p-type silicon substrate 2 in the direction in which interlayer dielectric films 4a to 4g are stacked are formed so as not to extend above a first $V_{SSi}$ interconnection 10a or to contact the first $V_{SSi}$ interconnection 10a.

Below the $V_{DDi}$ pad 8, the second and fourth $V_{DDi}$ interconnection main bodies 6b and 6d and third and fifth $V_{SSi}$ interconnections 10c and 10e are alternately stacked, above the two edges of the first $V_{SSi}$ interconnection 10a, along the direction in which the interlayer dielectric films 4a to 4g are stacked. In addition, above the central portion of the first $V_{SSi}$ interconnection 10a, second and fourth $V_{SSi}$ interconnections 10b and 10d and the third and fifth $V_{DDi}$ interconnection main bodies 6c and 6e are alternately stacked along the direction in which the interlayer dielectric films 4a to 4g are stacked. That is, above the first $V_{SSi}$ interconnection 10a, the second to fifth $V_{DDi}$ interconnection main bodies 6b to 6e and the $V_{SSi}$ interconnections 10b to 10e are alternately arranged in the direction in which the interlayer dielectric films 4a to 4g are stacked and in the direction perpendicular to the direction in which the interlayer dielectric films 4a to 4g are stacked.

In the semiconductor device 41 of this embodiment as described above, unlike in the semiconductor devices 1 and 31 of the first and second embodiments, the $V_{DDi}$ interconnections 5 and $V_{DDi}$ interconnection main bodies 6a to 6e and the $V_{SSi}$ interconnections 10a to 10e different in potential are formed in positions at which capacitance elements 22 are formed not only by interconnections adjacent to each other in the direction in which the interlayer dielectric films 4a to 4g are stacked but also by interconnections adjacent to each other in the direction perpendicular to the direction in which the interlayer dielectric films 4a to 4g are stacked. Note that although not shown in FIG. 7, this interconnection arrangement below the $V_{DDi}$ pad 8 is similarly applicable to a portion below the $V_{SSi}$ pad 13.

FIG. 6 schematically shows an outline of the arrangement of the semiconductor device 41 of this embodiment explained above. As described above, in portions where the $V_{DDi}$ pad 8, $V_{DDi}$ interconnections 5a to 5e, $V_{DDi}$ interconnection main bodies 6a to 6e, and $V_{SSi}$ interconnections 10a to 10e are adjacent to each other along the direction in which the interlayer dielectric films 4a to 4g are stacked, capacitance elements 22a (22) are formed in portions where the conductors (pads, interconnections, and interconnection main bodies) having different potentials are adjacent to each other. In addition, in portions where the $V_{DDi}$ pad 8, $V_{DDi}$ interconnections 5a to 5e, $V_{DDi}$ interconnection main bodies 6a to 6e, and $V_{SSi}$ interconnections 10a to 10e are adjacent to each other along the direction perpendicular to the direction in which the interlayer dielectric films 4a to 4g are stacked, capacitance elements 22b (22) are formed in portions where conductors (interconnections and interconnection main bodies) having different potentials are adjacent to each other. Of the capacitance elements 22 (22a and 22b), the capacitance elements 22b formed along the direction perpendicular to the direction in which the interlayer dielectric films 4a to 4g are stacked are formed as capacitance elements 22b which positively use not only electric fields generated inside the conductors as the electrodes of the capacitance elements 22b, but also electric fields generated to extend outside the edges (fringes) of these conductors (electrodes). That is, the capacitance elements 22b formed along the direction perpendicular to the direction in which the interlayer dielectric films 4a to 4g are stacked are formed as capacitance elements 22b which positively use a so-called fringe effect.

In the semiconductor device 41 of this embodiment as described above, a plurality of capacitance elements 22a which mainly use electric fields generated inside the conductors as the electrodes are formed along the direction in which the interlayer dielectric films 4a to 4g are stacked, as in the semiconductor devices 1 and 31 of the first and second embodiments. In addition, in the semiconductor device 41, a plurality of capacitance elements 22b which mainly use not only electric fields generated inside the conductors as the electrodes but also a so-called fringe effect are formed along the direction perpendicular to the direction in which the interlayer dielectric films 4a to 4g are stacked.

Also, for the semiconductor device 41 of this embodiment, the present inventors performed the same simulation as in the first embodiment. The results of the simulation of the semiconductor device 41 will be explained in the fourth embodiment (to be described later) together with the results of the simulation of the semiconductor device 1 of the first embodiment and a semiconductor device 51 of the fourth embodiment.

In the third embodiment as described above, the same effects as in the first and second embodiments can be obtained. Also, in the semiconductor device 41 of this embodiment, the capacitance elements 22b which use the fringe effect are formed along the direction perpendicular to the direction in which the interlayer dielectric films 4a to 4g are stacked, in addition to the capacitance elements formed in the direction in which the interlayer dielectric films 4a to 4g are stacked. In the semiconductor device 41, therefore, the degree of integration of the capacitance elements 22 below the $V_{DDi}$ pad 8 ($V_{SSi}$ pad 13) is substantially increased compared to the semiconductor devices 1 and 31 of the first and second embodiments. That is, in the semiconductor device 41, the capacitance value below the $V_{DDi}$ pad 8 ($V_{SSi}$ pad 13) is increased by using a so-called fringe capacitance. Accordingly, the surge absorptivity and ESD resistance of the semiconductor device 41 are increased compared to the semiconductor devices 1 and 31 of the first and second embodiments. According to the simulation performed by the present inventors, the surge absorptivity of the semiconductor device 41 of this embodiment was about 1.4 times that of the semiconductor devices 1 and 31 of the first and second embodiments.

In addition, the spaces between the $V_{DDi}$ pad 8, $V_{SSi}$ pad 13, and p-type silicon substrate 2 of the semiconductor device 41 and the area of the semiconductor device 41 can be used more effectively than in the semiconductor devices 1 and 31 of the first and second embodiments. Consequently, it is possible to realize high integration and downsizing of the semiconductor device 41 and improve the durability and reliability of the semiconductor device 41 at the same time on a higher level.

Fourth Embodiment

Figure 8:
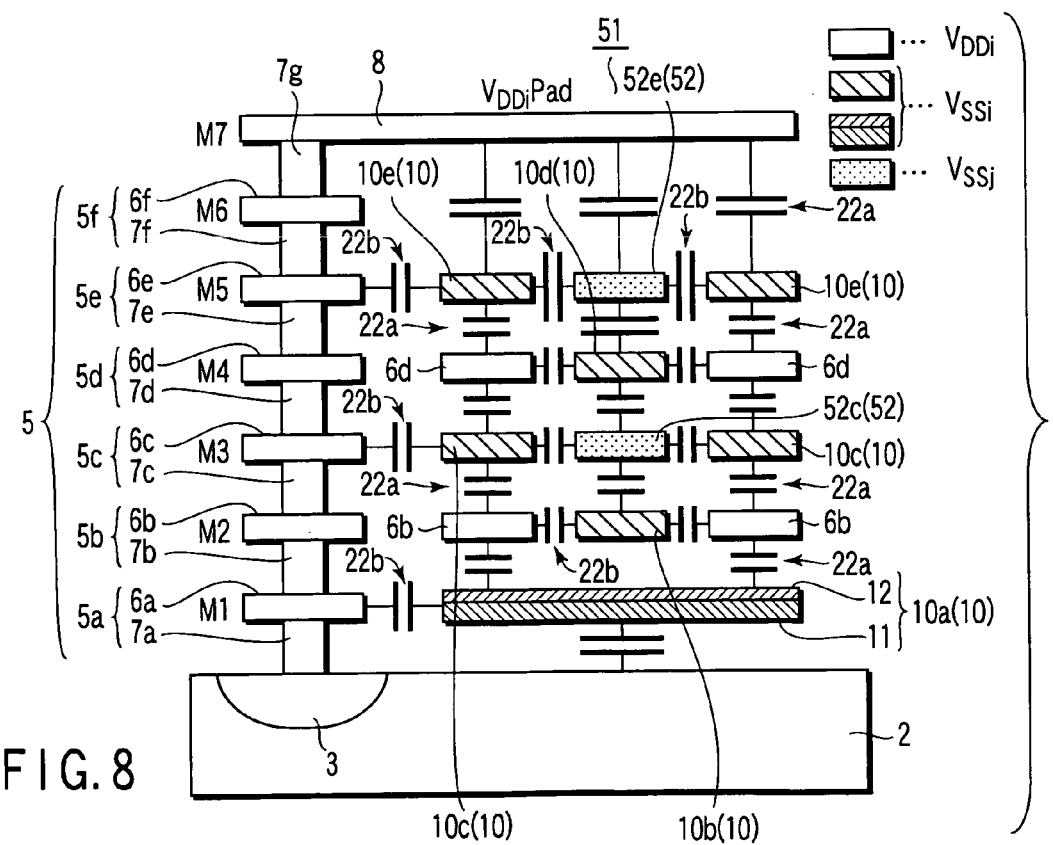
FIG. 8 is a view schematically showing an outline of the arrangement of a semiconductor device according to the fourth embodiment.
Figure 9:
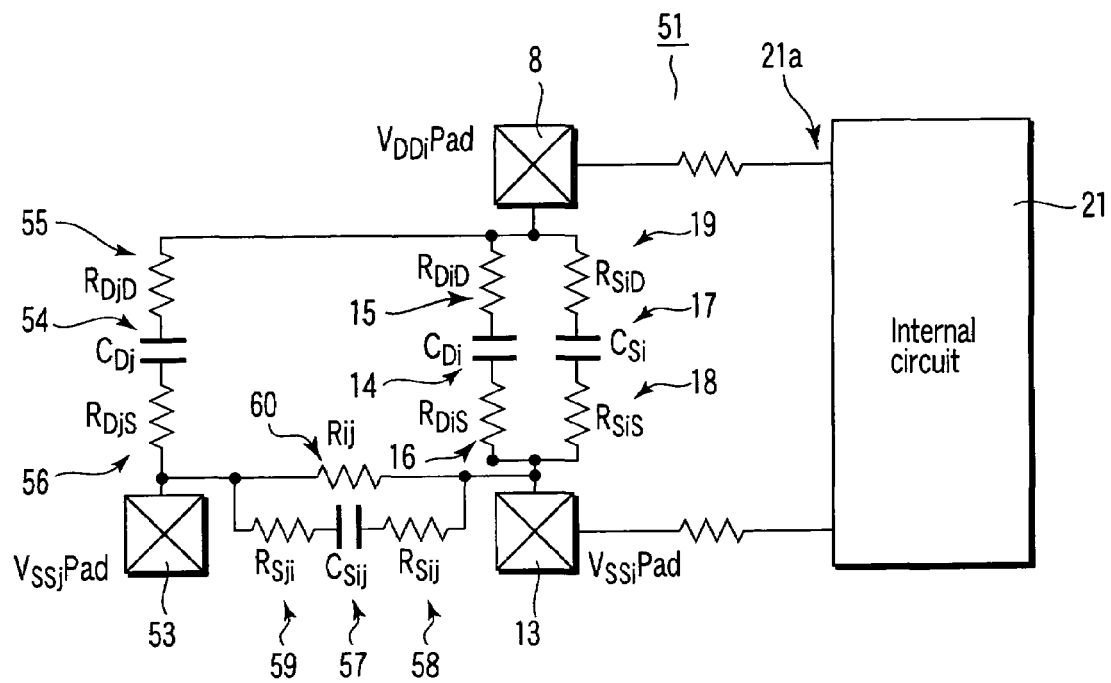
FIG. 9 is a view showing an outline of the circuit configuration of the semiconductor device according to the fourth embodiment.
Figure 11:
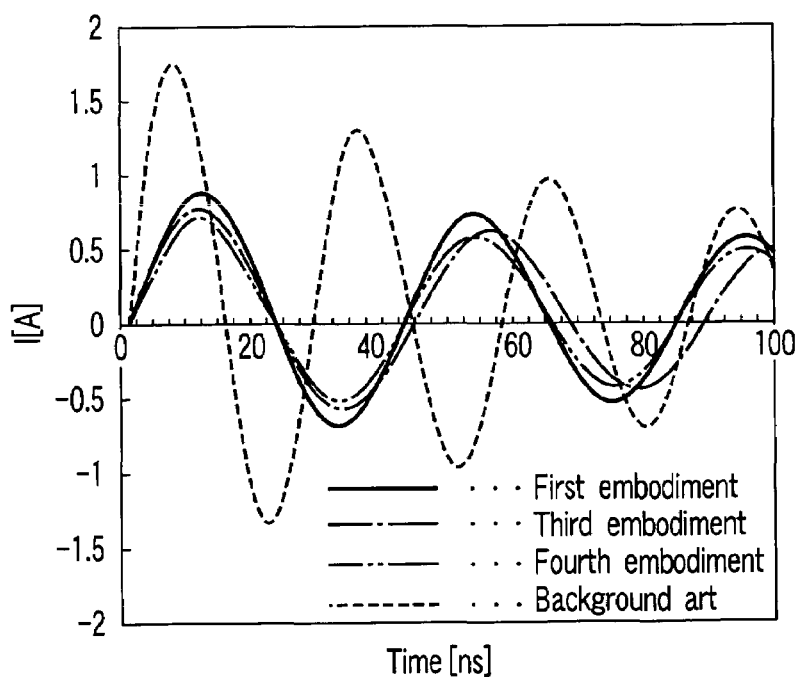
FIG. 11 is a graph which compares the magnitudes of overcurrents flowing through the semiconductor devices according to the first, third, and fourth embodiments and the magnitude of the overcurrent flowing through the semiconductor device according to the background art.
Figure 10:
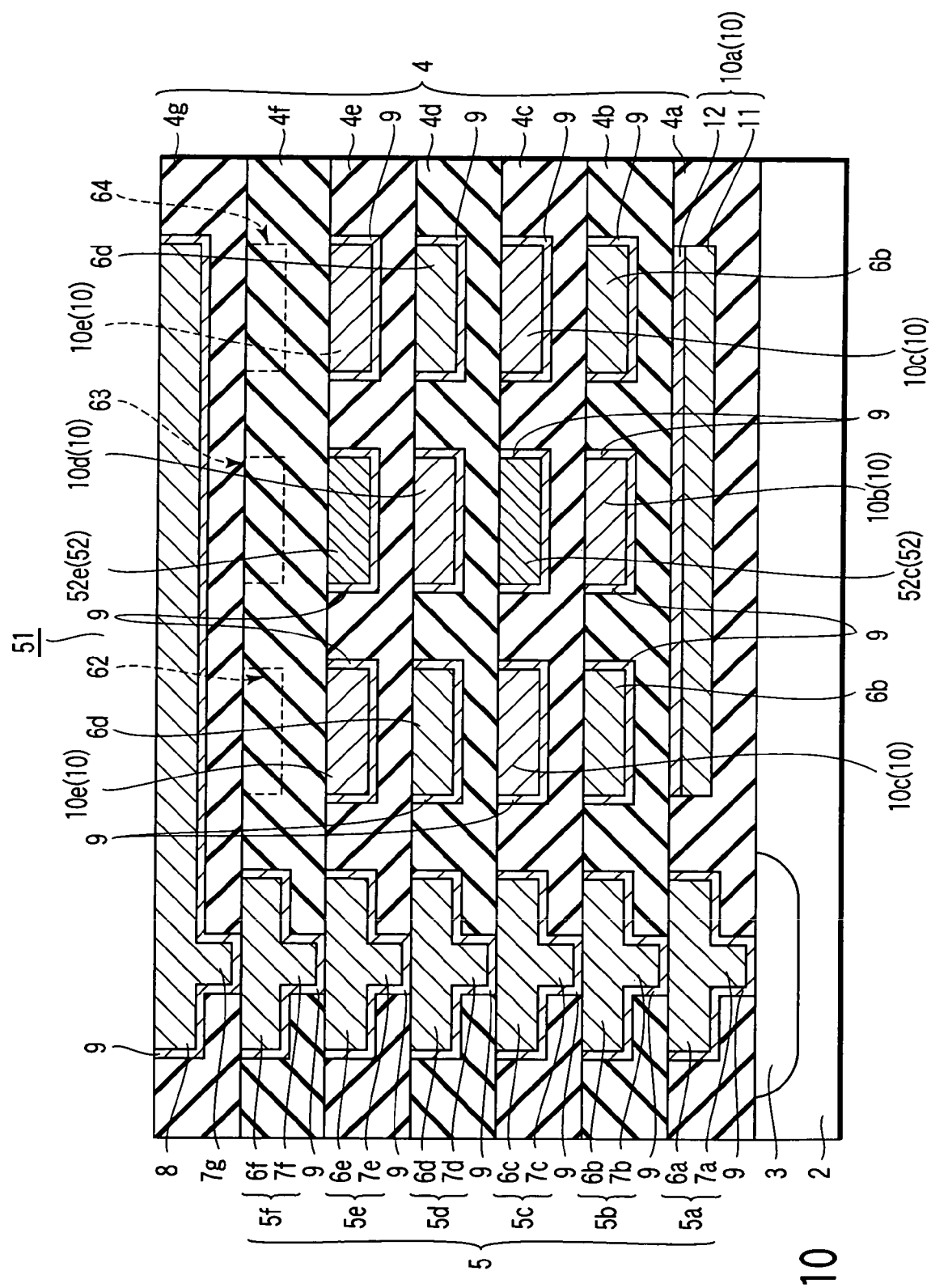
FIG. 10 is a sectional view showing an outline of the semiconductor device according to the fourth embodiment.

The fourth embodiment according to the present invention will be described below with reference to FIGS. 8 to 11. FIG. 8 is a view schematically showing an outline of the arrangement of a semiconductor device according to this embodiment. FIG. 9 is a view showing an outline of the circuit configuration of the semiconductor device according to this embodiment. FIG. 10 is a sectional view showing an outline of the semiconductor device according to this embodiment. FIG. 11 is a graph which compares the magnitudes of overcurrents flowing through the semiconductor devices according to this embodiment and the first and second embodiments with the magnitude of the overcurrent flowing through the semiconductor device according to the background art. Note that the same reference numerals as in the first to third embodiments described above denote the same parts, and a detailed explanation thereof will be omitted.

In this embodiment, a third pad and third conductive layer to which a third potential is applied are added to the first to third embodiments. This embodiment will be explained below.

Although not shown in FIG. 10, a seventh interlayer dielectric film 4g of a semiconductor device 51 of this embodiment has a third pad in addition to a $V_{DDi}$ pad 8 and $V_{SSi}$ pad 13 formed in the semiconductor devices 1, 31, and 41 of the first, second, and third embodiments, respectively. $V_{SSj}$ as a third potential different from a first potential $V_{DDi}$ and second potential $V_{SSi}$ is applied to the third pad.

As shown in FIG. 10, in first conductive layers ($V_{DDi}$ interconnections) 5a to 5f as the first to sixth layers of the semiconductor device 51 of this embodiment, $V_{DDi}$ interconnections 6a to 6f which electrically connect the $V_{DDi}$ pad 8 and a heavily doped diffusion layer 3 of a p-type silicon substrate 2 in a direction in which interlayer dielectric films 4a to 4g are stacked are formed so as not to extend above a first $V_{SSi}$ interconnection 10a or to contact the first $V_{SSi}$ interconnection 10a.

Below the $V_{DDi}$ pad 8, the second and fourth $V_{DDi}$ interconnection main bodies 6b and 6d and third and fifth $V_{ssi}$ interconnections 10c and 10e are alternately stacked, above the two edges of the first $V_{SSi}$ interconnection 10a, along the direction in which the interlayer dielectric films 4a to 4g are stacked. In addition, above the central portion of the first $V_{SSi}$ interconnection 10a, third interconnecting layers 52c and 52e as the third and fifth layers of third conductive layers (third interconnecting layers) 52 electrically connected to the third pad and the second and fourth $V_{ssi}$ interconnections 10b and 10d are alternately stacked along the direction in which the interlayer dielectric films 4a to 4g are stacked. That is, above the first $V_{SSi}$ interconnection 10a, the conductors (interconnections and interconnection main bodies) different in potential are juxtaposed adjacent to each other in the direction in which the interlayer dielectric films 4a to 4g are stacked and in a direction perpendicular to the direction in which the interlayer dielectric films 4a to 4g are stacked.

The third interconnecting layers 52 are a $V_{SSj}$ interconnections electrically connected to the $V_{SSj}$ pad as the third pad. Also, a barrier metal film 9 is formed on all the $V_{SSj}$ interconnections 52 including the third and fifth $V_{SSj}$ interconnections 52c and 52e, as well as the $V_{DDi}$ interconnections 5 and $V_{SSi}$ interconnections 10.

In the semiconductor device 51 of this embodiment as described above, the conductors (interconnections and interconnection main bodies) are formed adjacent to each other not only in the direction in which the interlayer dielectric films 4a to 4g are stacked but also in the direction perpendicular to the direction in which the interlayer dielectric films 4a to 4g are stacked, as in the semiconductor device 41 of the third embodiment. More specifically, in the semiconductor device 51, the $V_{DDi}$ interconnections 5a to 5e, $V_{DDi}$ interconnection main bodies 6a to 6e, the $V_{SSi}$ interconnections 10a to 10e, and $V_{SSj}$ interconnections 52c and 52e different in potential are formed in positions at which capacitance elements 22 are formed not only by interconnections adjacent to each other in the direction in which the interlayer dielectric films 4a to 4g are stacked but also by interconnections adjacent to each other in the direction perpendicular to the direction in which the interlayer dielectric films 4a to 4g are stacked. Note that although not shown in FIG. 7, this interconnection arrangement below the $V_{DDi}$ pad 8 is similarly applicable to a portion below the $V_{SSi}$ pad 13 or $V_{SSj}$ pad.

FIG. 8 schematically shows an outline of the arrangement of the semiconductor device 51 of this embodiment explained above. As described above, in portions where the $V_{DDi}$ pad 8, $V_{DDi}$ interconnections 5a to 5e, $V_{DDi}$ interconnection main bodies 6a to 6e, $V_{SSi}$ interconnections 10a to 10e, and $V_{SSj}$ interconnections 52c and 52e are adjacent to each other along the direction in which the interlayer dielectric films 4a to 4g are stacked, capacitance elements 22a (22) are formed in portions where the conductors (pads, interconnections, and interconnection main bodies) having different potentials are adjacent to each other. In addition, in portions where the $V_{DDi}$ pad 8, $V_{DDi}$ interconnections 5a to 5e, $V_{DDi}$ interconnection main bodies 6a to 6e, $V_{SSi}$ interconnections 10a to 10e, and $V_{SSj}$ interconnections 52c and 52e are adjacent to each other along the direction perpendicular to the direction in which the interlayer dielectric films 4a to 4g are stacked, capacitance elements 22b (22) are formed in portions where the conductors (interconnections and interconnection main bodies) having different potentials are adjacent to each other. That is, in the semiconductor device 51 of this embodiment, as in the semiconductor device 41 of the third embodiment, a plurality of capacitance elements 22a which mainly use electric fields generated inside the conductors as the electrodes are formed along the direction in which the interlayer dielectric films 4a to 4g are stacked. In addition, in the semiconductor device 51, a plurality of capacitance elements 22b which use not only electric fields generated inside the conductors as the electrodes but also the fringe effect are formed along the direction perpendicular to the direction in which the interlayer dielectric films 4a to 4g are stacked.

FIG. 9 shows an outline of the circuit configuration of the semiconductor device 51 of this embodiment explained above. In the semiconductor device 51 of this embodiment, unlike in the semiconductor devices 1, 31, and 41 of the first, second, and third embodiments, circuits are formed not only between the $V_{DDi}$ pad 8 and $V_{SSi}$ pad 13 but also between the $V_{DDi}$ pad 8 and a $V_{SSj}$ pad 53 and between the $V_{SSi}$ pad 13 and $V_{SSj}$ pad 53. More specifically, a capacitance element $C_{Dj}$ 54 and wiring resistances $R_{DjD}$ 55 and $R_{DjS}$ 56 are formed between the $V_{DDi}$ pad 8 and $V_{SSj}$ pad 53. Also, a capacitance element $C_{Sij}$ 57 and wiring resistances $R_{Sij}$ 58 and $R_{Sji}$ 59 are formed between the $V_{SSi}$ pad 13 and $V_{SSj}$ pad 53. In addition, a wiring resistance $R_{ij}$ 60 is formed between the $V_{SSi}$ pad 13 and $V_{SSj}$ pad 53.

An experiment conducted by the present inventors will be described below with reference to FIG. 11. In this experiment, the simulation explained in the first embodiment was performed on machine models (MMs) of the semiconductor devices 1, 41, and 51 of the first, third, and fourth embodiments and the semiconductor device according to the background art. As shown in the graph of FIG. 11, the surge of the semiconductor device 41 of the third embodiment in which a plurality of capacitance elements 22b using the fringe effect between the capacitance electrodes were added to the semiconductor device 1 of the first embodiment was reduced compared to the semiconductor device 1. This is presumably because the surge absorptivity of the semiconductor device 41 of the third embodiment was increased to about 1.4 times that of the semiconductor device 1 of the first embodiment. Likewise, the surge of the semiconductor device 51 of the fourth embodiment in which the third pad ($V_{SSj}$ pad) 53 and third conductive layer ($V_{SSj}$ interconnection) 52 were added to the semiconductor device 1 of the first embodiment and a plurality of capacitance elements 22b using the fringe effect between the capacitance electrodes were also additionally formed was further reduced compared to the semiconductor devices 1 and 41 of the first and third embodiments. That is, the ESD resistance of the semiconductor device 41 of the third embodiment was higher than that of the semiconductor device 1 of the first embodiment, which was increased to about twice that of the semiconductor device according to the background art. The ESD resistance of the semiconductor device 51 of the fourth embodiment was still higher than that of the semiconductor device 41 of the third embodiment.

In the fourth embodiment as described above, the same effects as in the first to third embodiments can be obtained. Also, in the semiconductor device 51 of this embodiment, the capacitance elements 22b which positively use the fringe effect between the electrodes of the adjacent capacitance elements 22 are formed below the $V_{DDi}$ pad 8 ($V_{SSi}$ pad 13 and $V_{SSj}$ pad 53), as in the semiconductor device 41 of the third embodiment. In addition, any two of the first, second, and third potentials $V_{DDi}$, $V_{SSi}$, and $V_{SSj}$ are applied to the electrodes of the capacitance elements 22a and 22b, such that the potential in the direction in which the interlayer dielectric films 4a to 4g are stacked differs from the potential in the direction perpendicular to the direction in which the interlayer dielectric films 4a to 4g are stacked. This greatly reduces the capacitance value below the pad by the use of the fringe capacitance. As a consequence, the surge absorptivity and ESD resistance of the semiconductor device 51 are extremely increased compared to the semiconductor devices 1, 31, and 41 of the first, second, and third embodiments. In addition, the spaces between the $V_{DDi}$ pad 8, $V_{SSi}$ pad 13, $V_{SSj}$ pad 53, and p-type silicon substrate 2 of the semiconductor device 51 and the area of the semiconductor device 51 can be used much more effectively than in the semiconductor devices 1, 31, and 41 of the first, second, and third embodiments. Accordingly, it is possible to realize high integration and downsizing and improve the durability and reliability of the semiconductor device 51 of this embodiment at the same time on an extremely high level.

Note that the semiconductor devices and their fabrication methods according to the present invention are not limited to the first to fourth embodiments described above. The present invention can be practiced by changing the arrangements and fabrication steps to various settings or by appropriately combining various settings without departing from the spirit and scope of the invention.

For example, in the semiconductor devices 1, 31, 41, and 51 of the first, second, third, and fourth embodiments described above, the conductive layer (interconnecting layer) formed in the insulating layer immediately below the $V_{DDi}$ pad 8 or the like is not used when forming the capacitance element 22 using the $V_{DDi}$ pad 8 or the like as one capacitance electrode, for the reason explained below. Generally, when a bonding wire is bonded to a pad of a semiconductor device, an external force by which the pad sinks into an interlayer dielectric film below the pad is applied to the pad. Accordingly, in a semiconductor device in which a bonding wire is to be bonded to a pad, for example, if a conductive layer formed in an interlayer dielectric film immediately below the pad is used when a capacitance element using the pad as one capacitance electrode is to be formed, this capacitance element is highly likely to be destroyed when the bonding wire is bonded to the pad. In the first to fourth embodiments described above, therefore, the conductive layer formed in the insulating layer immediately below the $V_{DDi}$ pad 8 or the like is not used by assuming the specifications by which a bonding wire is bonded to the $V_{DDi}$ pad 8 or the like.

When, however, the electrode of another device or package (not shown) is to be connected, by flip chip bonding, to the $V_{DDi}$ pad 8 or the like of the semiconductor device 1, 31, 41, or 51, an external force applied to the $V_{DDi}$ pad 8 or the like is much smaller than that in wire bonding, so the capacitance element 22 can be formed by using the conductive layer formed in the insulating film immediately below the $V_{DDi}$ pad 8 or the like. More specifically, as indicated by the broken lines in FIGS. 3, 7, and 10, the capacitance element 22 can be formed by using, as electrodes, the conductive layers 61, 62, 63, and 64 formed in the sixth interlayer dielectric film 4f immediately below the seventh interlayer dielectric film 4g in which the $V_{DDi}$ pad 8 is formed, together with the $V_{DDi}$ pad 8. Note that the interconnecting structures of the semiconductor devices 1, 31, 41, and 51 of the first, second, third, and fourth embodiments are naturally applicable to flip chip bonding.

Also, when an active element (not shown) or the like is to be formed in the surface layer of the p-type silicon substrate 2 below the $V_{DDi}$ pad 8 or the like, the capacitance element 22 need not be formed by using the first $V_{SSi}$ interconnection 10a (polysilicon layer 11) and p-type silicon substrate 2. Additionally, in the semiconductor device 51 of the fourth embodiment, the $V_{SSj}$ pad 53 as the third pad may also be grounded similar to the $V_{SSi}$ pad 13 as the second pad of the semiconductor device 31 of the second embodiment.

Also, the materials forming the interlayer dielectric films 4, first conductive layers 5, second conductive layers 10, third conductive layers 52, first pad 8, second pad 13, third pad 53, barrier metal film 9, and the like are not limited to the materials mentioned earlier. Similarly, the thicknesses and numbers of the interlayer dielectric films 4, first conductive layers 5, second conductive layers 10, third conductive layers 52 are not limited to those described above. Likewise, the areas of the first pad 8, second pad 13, and third pad 53 and the spacings, dimensions, and relative positions of the first pad 8, second pad 13, third pad 53, first conductive layers 5, second conductive layers 10, and third conductive layers 52 are not limited to the dimensions and positions described above. Analogously, the potentials applied to the first pad 8, second pad 13, and third pad 53 are not limited to the above-mentioned potentials and magnitudes. These conditions can be appropriately set in accordance with the desired semiconductor device specifications and with the capacitances of the capacitance elements 22 formed below the first, second, and third pads 8, 13, and 53.

Furthermore, needless to say, this invention can be applied not only to $V_{DDi}$ pads for power-supply lines, but also to, for example, input/output pads.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:
    at least one first pad, the first pad being formed above a substrate and given a first potential;
    at least one first conductive layer, the first conductive layer being formed between the first pad and the substrate so as to be electrically connected to the first pad;
    at least one second pad, the second pad being formed above the substrate so as to sandwich said at least one first conductive layer between the second pad and the substrate, and given a second potential different from the first potential;

at least one second conductive layer, the second conductive layer being formed between the first and second pads and the substrate so as to be electrically connected to the second pad; and a plurality of insulating layers, the insulating layers being stacked on the substrate, at least one first pad, at least one second pad, at least one first conductive layer, and at least one second conductive layer being formed in predetermined ones of the insulating layers, and at least one of the insulating layers being sandwiched, as an inter-electrode insulator of a capacitance element, between at least one of the first pad and first conductive layer and at least one of the second pad and second conductive layer in at least one of a direction in which the insulating layers are stacked and a direction perpendicular to the direction in which the insulating layers are stacked.

2. A device according to claim 1, further comprising:

at least one third pad, the third pad being formed in a predetermined one of the insulating layers, and given a third potential different from at least one of the first and second potentials; and at least one third conductive layer, the third conductive layer being formed in a predetermined one of the insulating layers between the first, second, and third pads and the substrate so as to be electrically connected to the third pad, and the third conductive layer being formed as one electrode of another capacitance element so as to sandwich at least one of the insulating layers between the third conductive layer and at least one of the first and second pads and first and second conductive layers.

3. A device according to claim 1, wherein one of the first and second potentials is a ground potential.

4. A device according to claim 1, wherein at least one of the first and second conductive layers formed in a layer closest to the substrate has a two-layered structure including a lower layer made of polysilicon and an upper layer made of silicide.

5. A device according to claim 1, wherein at least one of the first and second conductive layers is extended to substantially the same size as the first or second pad to which the conductive layer is electrically connected.

6. A device according to claim 1, wherein the semiconductor device includes at least one of an interconnecting structure in which the first pad, first conductive layer, and second conductive layer are alternately arranged in at least one of the direction in which the insulating layers are stacked and the direction perpendicular to the direction in which the insulating layers are stacked, and an interconnecting structure in which the second pad, second conductive layer, and first conductive layer are alternately stacked in at least one of the direction in which the insulating layers are stacked and the direction perpendicular to the direction in which the insulating layers are stacked.

7. A device according to claim 1, further comprising:

at least one region in which a conductor is formed, the region being formed in a surface layer of the substrate, and at least one of the first pads or the second pads being electrically connected to the region; and at least one still another capacitance element, said still another capacitance element including at least one of the first and second conductive layers formed in a layer closest to the substrate so as to be electrically connected to the pad different from the pad electrically connected to the region, at least one of the insulating layers sandwiched between the conductive layer and the substrate, and the substrate.

8. A device according to claim 1, further comprising:

at least one region in which a conductor is formed, the region being formed in a surface layer of the substrate, and at least one of the first pads or the second pads being electrically connected to the region; and the pad electrically connected to the region, the first and second conductive layers formed between the pad and the substrate being formed along the direction in which the insulating layers are stacked.

9. A device according to claim 2, wherein one or two of the first, second, and third potentials are a ground potential.

10. A device according to claim 2, wherein said still another capacitance element is formed together with at least one of the first, second, and third pads by using at least one of the first, second, and third conductive layers formed in the insulating layer at least two layers below the insulating layer in which at least one of the first, second, and third pads is formed.

11. A device according to claim 2, wherein at least one of the first, second, and third conductive layers formed in a layer closest to the substrate has a two-layered structure including a lower layer made of polysilicon and an upper layer made of silicide.

* * * * *